(12) United States Patent
Sumitani et al.

(10) Patent No.: US 7,832,895 B2
(45) Date of Patent: Nov. 16, 2010

(54) LIGHT EMITTING DEVICE

(75) Inventors: Naofumi Sumitani, Itano-gun (JP);
Kiyomi Maruyama, Tokushima (JP)

(73) Assignee: Nichia Corporation, Anan-shi (JP)

( * ) Notice: Subject to any disclaimer, the term of this patent is extended or adjusted under 35 U.S.C. 154(b) by 379 days.

(21) Appl. No.: 12/101,324

(22) Filed: Apr. 11, 2008

(65) Prior Publication Data
US 2008/0259598 A1 Oct. 23, 2008

(30) Foreign Application Priority Data
Apr. 17, 2007 (JP) .............................. 2007-107695

(51) Int. Cl.
*F21V 9/08* (2006.01)

(52) U.S. Cl. .................................. 362/235; 362/249.02
(58) Field of Classification Search ................. 362/235, 362/249.02, 260
See application file for complete search history.

(56) References Cited

U.S. PATENT DOCUMENTS

| 5,048,035 A | 9/1991 | Sugawara et al. |
| 5,153,889 A | 10/1992 | Sugawara et al. |
| 6,333,779 B1 | 12/2001 | Tabata et al. |
| 2003/0042844 A1 | 3/2003 | Matsumura et al. |
| 2004/0206964 A1 | 10/2004 | Matsumura et al. |
| 2005/0017621 A1* | 1/2005 | Leo ........................... 313/116 |

FOREIGN PATENT DOCUMENTS

| JP | 2000-196820 A | 7/2000 |
| JP | 2001-196637 A | 7/2001 |
| JP | 2002-237617 A | 8/2002 |
| JP | 2003-77318 A | 3/2003 |
| JP | 2007-88248 A | 4/2007 |

\* cited by examiner

*Primary Examiner*—David V Bruce
(74) *Attorney, Agent, or Firm*—Global IP Counselors, LLP

(57) ABSTRACT

The device includes a blue light emitting region having a first light emitting part and a yellow light emitting region having a second light emitting part and a wavelength converting member arranged to absorb light from the second light emitting part and to convert the wavelength thereof to emit yellow light. The second light emitting part has a higher output than that of the first light emitting part. With this arrangement, output of the yellow light can be increased, so that the device can be used in an image reading apparatus with a high sensitivity.

9 Claims, 3 Drawing Sheets

LIGHT EMITTING DEVICE

BACKGROUND OF THE INVENTION

1. Field of the Invention

The present invention relates to a light emitting device in which a light emitting element is mounted.

2. Background Information

An image reading device such as an image sensor is used in an apparatus such as a facsimile, a copier, and a hand scanner to read an original document. Generally used as such an image reading device is a contact image sensor which has a short optical path and is easily incorporated into an apparatus.

A contact image sensor includes a line lighting device for linearly illuminating an original document surface over a main scanning range. Conventionally known line lighting devices include a direct lighting type in which light emitting devices provided with a semiconductor light emitting element (hereinafter may be referred to as LED) are arranged in linear order to illuminate linearly, and an indirect lighting type in which a long light guiding member is used and the light which is introduced from a light emitting device arranged at the end surface of the light guide member is propagated along the length direction while repeating reflection in the inner surface and is emitted from the emission surface thereof.

When reading a black-and-white image, such a line lighting device typically uses single-color LEDs of two different emission colors in combination, such as a green LED and a red LED or a blue LED and a yellow LED. On the other hand, when reading a full-color image, single-color LEDs of three different emission colors; a red LED, a green LED, and a blue LED, are typically used as, for example, described in JP-2000-196820A.

Conventionally known materials for LEDs include; ZnSe and a nitride based semiconductor such as $In_XAl_YGa_{1-X-Y}N$ ($0 \leq X$, $0 \leq Y$, $X+Y \leq 1$) etc. for a green LED; GaAs, GaAlAs, AlInGaP etc. for a red LED; and ZnSe and nitride-system semiconductors such as $In_XAl_YGa_{1-X-Y}N$ ($0 \leq X$, $0 \leq Y$, $X+Y \leq 1$) etc. for a blue LED. In addition, a light emitting diode of InGaAlP-system as described, for example, in JP2002-237617A are known as a material for a yellow LED.

However, when reading a black-and-white image, if a green LED and a red LED are used, the output needs to be increased due to their low sensitivity for reading. Moreover, a combination of a blue LED and a yellow LED is not practical because the output of a yellow LED having a composition as described above is too low compared with that of a blue LED.

In recent years it has been considered to use a LED of a fourth emission color in addition to red, green, and blue emission colors, to increase the color reproducibility when reading a full-color image. A yellow LED is however also impractical in such a case because of its low output.

SUMMARY OF THE INVENTION

Accordingly, the present invention is devised to solve the aforementioned problems and it is an object of the present invention to provide a light emitting device which has a high output power as a light source used for a image reading device.

To accomplish the above object, a light emitting device according to an aspect of the present invention includes a blue light emitting region having a first light emitting part, and a yellow light emitting region having a second light emitting part and a wavelength converting member which is arranged to absorb light from the second light emitting element and to convert the wavelength thereof to emit yellow light. The second light emitting part has a higher output than that of the first light emitting part. With this arrangement, output of yellow light can be increased, so that the light emitting device can be used for an image reading device of high sensitivity.

A light emitting device according to a second aspect of the present invention includes a second light emitting part having a larger light emitting area than that of the first light emitting part described above.

A light emitting device according to a third aspect of the present invention includes a second light emitting part having a plurality of light emitting elements. With this arrangement, luminance efficiency in a high current region can be improved.

A light emitting device according to a fourth aspect of the present invention includes a yellow light emitting region having a plurality of light emitting regions spaced apart from each other. With this configuration, the arrangement of each of the emission colors can be selected at will. Therefore, when the light is introduced in a light guiding member and the like, propagation of light within the light guiding member can be controlled.

According to the present invention, a light emitting device that has yellow emission of high output can be obtained, so that improvement in the sensitivity of an image reading device can be achieved.

DETAILED DESCRIPTION OF THE PREFERABLE EMBODIMENTS

Figure 1A:
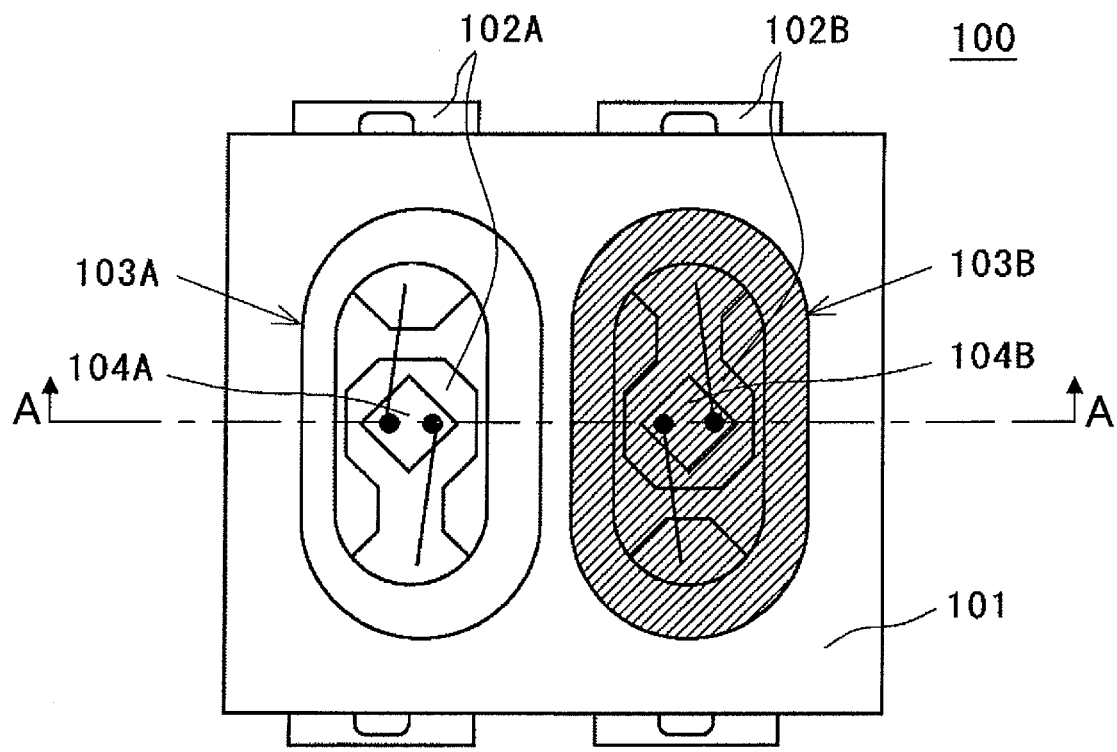
FIG. 1A is a front elevational view showing an example of a light emitting device according to Embodiment 1 of the present invention.

The preferred embodiments of the present invention will be described below with reference to the accompanying drawings. Herein, the form of the following embodiments are intended as examples of a light emitting device that are representative of the technology behind the present invention, and any limitation of the scope of the invention by the embodiments is not intended.

In addition, the present specification will by no means limit the members described in claims to the members described in the embodiments. Especially, size, material, shape, and the relative configuration etc. of the components described in the preferred embodiments are for illustration purpose only, and do not intend to limit the invention therein, unless specifically described. In the drawings, the size and the positional relationship of the components may be exaggerated for clarity. Further, in the description below, substantially identical members or members of substantially the same quality are assigned the same names and reference numerals and detailed description thereof will be arbitrarily omitted. In each constituting component of the present invention, multiple components may be constructed using substantially the same member so that one member can serve as multiple components, or vice versa, a function of a member may be shared by multiple members.

Embodiment 1

Figure 1B:
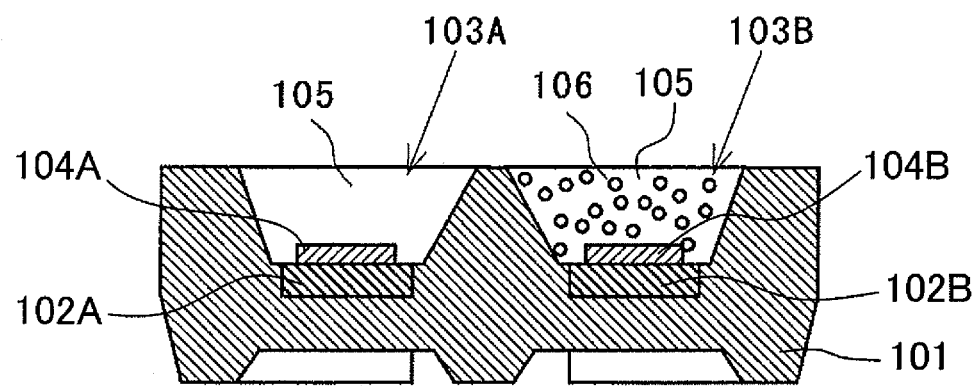
FIG. 1B is a cross-sectional view of the light emitting device according to Embodiment 1 of the present invention as taken along a section line A-A in FIG. 1A.

FIG. 1A is a front elevational view showing an example of a light emitting device 100 according to Embodiment 1, FIG. 1B is a cross-sectional view taken along a section line A-A of FIG. 1A. In Embodiment 1, a base substrate 101 of the light emitting device 100 is made of a resin and includes recesses 103A and 103B each with an upward opening defined by an annular side surface and a bottom surface. As conductive members, lead frames 102A and 102B are provided respectively on the bottom surface of the recesses so as to be exposed therefrom. A part of each of the lead frames 102A and 102B is enclosed in the base substrate 101 and another part of each of the lead frames 102A and 102B extends outwardly from the side surface of the base substrate 101 and bent to be arranged at the back surface side of the base substrate 101. Accordingly, the lead frames 102A and 102B serve as conductor wiring for the semiconductor light emitting elements 104A and 104B, and other components arranged on the base substrate 101. The semiconductor light emitting elements 104A and 104B are fixed respectively on the lead frames 102A and 102B by a die bonding member (not shown in the figure) such as a resin and a metal paste. Then, the p-electrodes and n-electrodes of the semiconductor light emitting elements are electrically connected respectively with the lead frames 102A and 102B by conductive wires (hereinafter may be referred to as "wire"). Further, a sealing member 105 such as resin is disposed in the recesses 103A and 103B so as to cover the components disposed within the recesses 103A and 103B.

In Embodiment 1, a first light emitting element of an InGaN-system blue light emitting element 104A is mounted in the recess 103A to form a first light emitting part of a blue light emitting region. A second light emitting element of an InGaN-system blue light emitting element 104B is mounted in the recess 103B to form a second light emitting part and a wavelength converting member 106 is included in the sealing member 105 to form a yellow light emitting region. Moreover, in the present embodiment, the output power of the second light emitting element 104B is higher than that of the first light emitting element 104A so as to improve the output power of the yellow light.

Second Light Emitting Element

The second light emitting element 104B used in the yellow light emitting region is preferably capable of emitting light with a main wavelength in the range from 360 nm to 490 nm, more preferably from 430 nm to 480 nm. Specifically, ZnSe and nitride based semiconductors ($In_xAl_yGa_{1-x-y}N$, $0 \leq X$, $0 \leq Y$, $X+Y \leq 1$) etc. can be used.

In Embodiment 1, as shown in FIGS. 1A and 1B, substantially identical light emitting elements are used for the second light emitting element 104B and the first light emitting element 104A, and a higher electric power is applied to the second light emitting element 104B than that to the first light emitting element 104A so that the output power of the second light emitting element 104B is higher than that of the first light emitting element 104A. For example, when a forward current of 10 mA is applied to the first light emitting element 104A and a forward current of 20 mA is applied to the second light emitting element 104B, the output power of the yellow light can be increased. In this case, a desired output power can be obtained by adjusting the amount of applied current in view of such as the amount of the wavelength converting member 106 and the color difference.

Yellow Light Emitting Region

A yellow light emitting region includes the second light emitting element 104B and the wavelength converting member 106 which is arranged to absorb light from the second light emitting element 104B and to convert the wavelength thereof to emit yellow light. For example, the opening portion of the recess 103B in FIG. 1A serves as the yellow light emitting region. The second light emitting element 104B is mounted in the recess 103B, and the recess 103B is filled with a light-transmissive member containing the wavelength converting member 106. The wavelength converting member 106 is arranged to absorb light from the second light emitting element 104B and to convert the wavelength thereof to emit yellow light.

In the present specification, the term "yellow light emission" means a light emission having the main peak wavelength in a range from 528 nm to 585 nm.

The shape of the yellow light emitting region (opening portion of the recess 103B) is not specifically limited to an approximately elliptical shape as shown in FIG. 1A. For example, a circular, square, rectangular, or polygonal shape, or a combination thereof can be employed as the shape of the yellow light emitting region. Moreover, a single yellow light emitting region can be provided as shown in FIG. 1A or a plurality of yellow light emitting regions can be provided. When a plurality of yellow light emitting regions is provided, a plurality of opening portions having substantially identical shape may be provided, or opening portions having different shapes may be provided.

Wavelength Converting Member

The wavelength converting member 106 used in the yellow light emitting region contains a fluorescent member which is arranged to absorb at least a part of light from the second light emitting element 104B and to emit yellow light.

It is more efficient when the fluorescent member can convert light from the semiconductor light emitting element to a light with longer wavelength. That is, it is preferable to use a light emitting element which can emit light with a shorter wavelength than yellow light. The fluorescent member may comprise a single layer made of a fluorescent material etc., may comprise a single layer made of mixture of two or more fluorescent materials etc., may comprise two or more stacked layers each of which made of a fluorescent material etc., or may comprise two or more stacked layers of single layers each of which is made of a mixture of two or more fluorescent materials etc.

The fluorescent material is preferably, for example, at least one selected from among alkaline earth metal aluminate fluorescent materials, alkaline earth silicates, alkaline earth thiogallates, rare earth element aluminates that are mainly activated with a lanthanoid element such as Ce, oxynitride-based fluorescent materials that are mainly activated with a lanthanoid element such as Eu or Ce. For example, the fluorescent materials described below can be used but it is not limited thereto.

Example of the alkaline earth metal aluminate fluorescent materials includes, but not limited to, $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, $BaMgAl_{10}O_{17}$:R (wherein R represents Eu or Mn, or both).

Example of the alkaline earth sulfide fluorescent materials includes, but not limited to, $SrGa_2S_4$:Eu, $La_2O_2$:S:Eu, $Y_2O_2$:S:Eu, and $Gd_2O_2$:S:Eu.

Example of the rare earth aluminate fluorescent material that is mainly activated with lanthanoid element such as Ce includes, but not limited to, YAG fluorescent materials represented by the formulas: $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, $(Y, Gd)_3(Al, Ga)_5O_{12}$. It also includes $Tb_3Al_5O_{12}$:Ce, and $Lu_3Al_5O_{12}$:Ce in which portion or all of Y is substituted with Tb or Lu etc.

If needed, at least one element selected from among Eu, Ce, Tb, Cu, Ag, Au, Cr, Nd, Dy, Co, Ni, and Ti may be contained in the fluorescent materials described above.

Example of the oxynitride-based fluorescent materials that are mainly activated with a lanthanoid element such as Eu or Ce at least include at least one group II element selected from the group consisting of Be, Mg, Ca, Sr, Ba, and Zn, and at least one group IV element selected from the group consisting of C, Si, Ge, Sn, Ti, Zr and Hf. Specific examples thereof is represented by the general formula $L_XM_YO_ZN_{((2/3)X+(4/3)Y-(2/3)Z)}$:R, or $L_XM_YQ_TO_ZN_{((2/3)X+(4/3)Y+T-(2/3)Z)}$:R (wherein L represents at least one group II element selected from the group consisting of Be, Mg, Ca, Sr, Ba, and Zn, M represents at least one group IV element selected from the group consisting of C, Si, Ge, Sn, Ti, Zr, and Hf, Q represents at least one group III element selected from the group consisting of B, Al, Ga, and In, and N represents nitrogen atom and R represents rare earth element, and wherein, $0.5<X<1.5$, $1.5<Y<2.5$, $0<T<0.5$, and $1.5<Z<2.5$. For example, $BaSi_2O_2N_2$:Eu, $CaSi_2O_2N_2$:Eu, or $SrSi_2O_2N_2$:Eu can be used.

The fluorescent members described above preferably have a composition capable of producing high conversion efficiency with respect to the main wavelength of the second light emitting element. For example, when the main wavelength of the second light emitting element is from 430 to 480 nm, it is preferable to employ a YAG-based fluorescent member, $SrAl_2O_4$:R, $Sr_4Al_{14}O_{25}$:R, $L_XM_YO_ZN_{((2/3)X+(4/3)Y-(2/3)Z)}$:R, $L_XM_YQ_TO_ZN_{((2/3)X+(4/3)Y+T-(2/3)Z)}$:R, or $L_XM_YQ_TO_ZN_{((2/3)X+(4/3)Y-(2/3)Z)}$:R, $SrGa_2S_4$:Eu or the like.

When the main wavelength of the second light emitting element is from 380 to 430 nm, it is preferable to employ $La_2O_2$:S:Eu, $Y_2O_2$:S:Eu, $Gd_2O_2$:S:Eu, $CaAl_2O_4$:R, $BaMg_2Al_{16}O_{27}$:R, $BaMg_2Al_{16}O_{12}$:R, $BaMgAl_{10}O_{17}$:R or the like.

When the main wavelength of the second light emitting element is from 200 to 380 nm, it is preferable to employ $La_2O_2$:S:Eu, $Y_2O_2$:S:Eu, $Gd_2O_2$:S:Eu, $CaAl_2O_4$:R, $BaMg_2Al_{16}O_{27}$:R, $BaMg_2Al_{16}O_{12}$:R, $BaMgAl_{10}O_{17}$:R, $SrAl_2O_4$:R, $Sr_4Al_{14}O_{25}$:R, $L_XM_YO_ZN_{((2/3)X+(4/3)Y-(2/3)Z)}$:R, or $L_XM_YQ_TO_ZN_{((2/3)X+(4/3)Y+T-(2/3)Z)}$:R, $SrGa_2S_4$:Eu or the like.

It is possible to use a fluorescent material which is other than the fluorescent materials described above and has substantially the same performance and effects as those of the fluorescent materials described above.

Blue Light Emitting Region

The blue light emitting region includes the first light emitting element 104A, and light from the first light emitting element 104A is propagated through and emitted from the blue light emitting region. For example, when the light transmissive sealing member 105 is filled in the recess 103A where the first light emitting element 104A is mounted as shown in FIG. 1A and FIG. 1B, light from the first light emitting element 104A propagates within the sealing member 105 and emitted outwardly from the opening portion of the recess 103A. Accordingly, the opening portion of the recess 103A serves as the blue light emitting region.

In the present specification, blue light emission with a main wavelength in a range of 420 nm to 490 nm is preferable, and a range of 430 nm to 480 nm is more preferable. Specifically, ZnSe and nitride-based semiconductors $(In_XAl_YGa_{1-X-Y}N, 0 \leq X, 0 \leq Y, X+Y \leq 1)$ etc. can be used.

The shape of the blue light emitting region (opening portion of the recess 103A) is not specifically limited to an approximately elliptical shape as shown in FIG. 1A. For example, a circular, square, rectangular, or polygonal shape, or a combination thereof can be employed as the shape of the blue light emitting region. Moreover, a single blue light emitting region can be provided as shown in FIG. 1A or a plurality of blue light emitting regions can be provided.

A first light emitting element used in a blue light emitting region is preferably arranged to emit light with a main wavelength in a range of 420 nm to 490 nm. Specifically, ZnSe and nitride-based semiconductors $(In_XAl_YGa_{1-X-Y}N, 0 \leq X, 0 \leq Y, X+Y \leq 1)$ etc. can be used.

Embodiment 2

Figure 2:
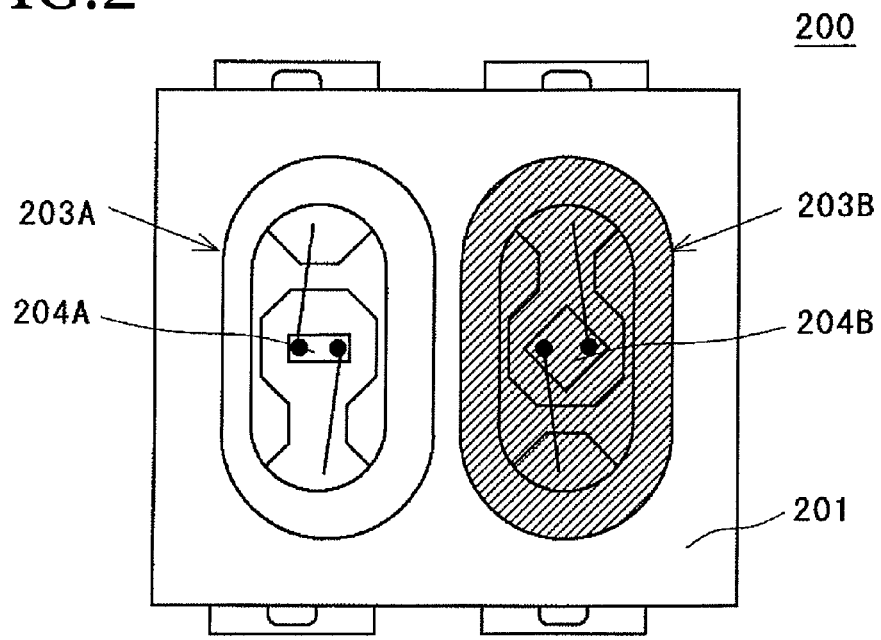
FIG. 2 is a front elevational view showing an example of a light emitting device according to Embodiment 2 of the present invention.

FIG. 2 is a front elevational view showing a light emitting device 200 according to Embodiment 2. In Embodiment 2, a light emitting element having a larger light emitting area than that of a first light emitting element 204A, which forms a first light emitting part, is used as a second light emitting element 204B, which forms a second light emitting part. In this case, even when approximately the same amount of the electric power is applied to the first light emitting element 204A and the second light emitting element 204B, the output of second light emitting element 204B is larger than that of the first light emitting element 204A, because the surface area of the light emitting elements 204A and 204B are different. With this arrangement, output of the yellow light emitting region can be increased without adding a complex structure to the circuit.

In FIG. 2, recesses 203A, 203B are defined in a base substrate 201 of the light emitting device 200 and the first light emitting element 204A and the second light emitting element 204B are mounted within the recesses 203A, 203B respectively. A sealing member containing a wavelength converting member is filled in the recess 203B to form a blue light emitting region which converts light from the second light emitting element and emits yellow light as in Embodiment 1. The recess 203A forms a blue light emitting region which releases light from the first light emitting element 204A, and has a shape of the light emitting region of approximately elliptical which is the same as that of the recess 203B of the yellow light emitting region.

The first light emitting element 204A and the second light emitting element 204B may have either substantially the same or different semiconductor layer structures and members, for example, except that the light emitting areas differ. In this specification, the term "light emitting area" means the area in top plan view of the light emitting element 204A or 204B in the front elevational view of the light emitting device 200 in FIG. 2. The first light emitting element 204A has a generally rectangular shape with approximately half the area of the generally square second light emitting element 204B. Although the two light emitting elements 204A and 204B have different shapes in the example shown in FIG. 2, they may have similar shapes with different sizes. Further, the area ratio between the first and second light emitting elements 204A and 204B is not specifically limited and can be variously set according to a desired output.

In addition, other than the light emitting elements 204A and 204B, substantially the same members as in Embodiment 1 can be used in Embodiment 2.

Embodiment 3

Figure 3:
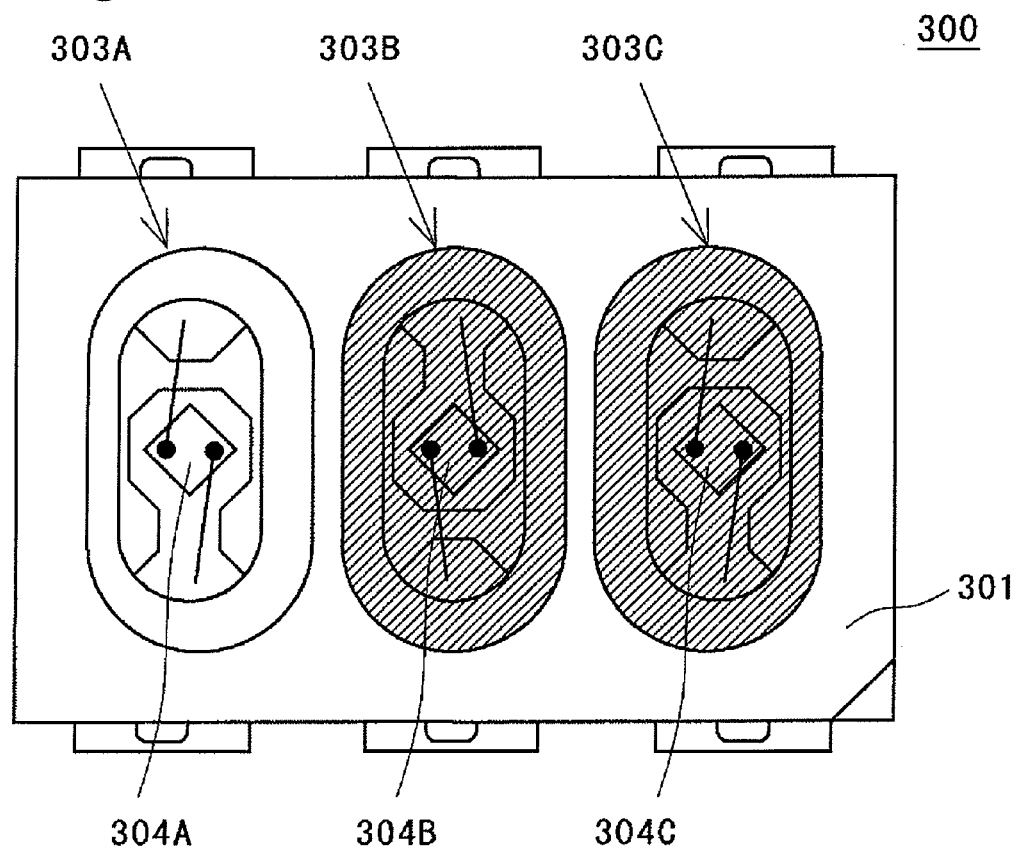
FIG. 3 is a front elevational view showing an example of a light emitting device according to Embodiment 3 of the present invention.

FIG. 3 is a front elevational view showing a light emitting device 300 according to Embodiment 3. In Embodiment 3, a plurality of light emitting elements 304B and 304C are used as second light emitting elements to collectively form a second light emitting part so as to obtain a higher output than that of a first light emitting element 304A, which forms a first light emitting part. With this arrangement, luminance efficiency in a high current region can be improved.

In FIG. 3, recesses 303A, 303B, and 303C are defined in a base substrate 301 of the light emitting device 300 and the light emitting elements 304A, 304B and 304C are mounted within the recesses 303A, 303B, and 303C, respectively. The first light emitting element 304A is mounted within the recess 303A to form a blue light emitting region. The second light emitting elements 304B and 304C are mounted within the recesses 303B and 303C respectively, and a sealing member containing a wavelength converting member is filled in the recesses 303B and 303C as in Embodiment 1. The wavelength converting member can convert light from the second light emitting element and emit yellow light. Thus, the recesses 303B and 303C serve as a yellow light emitting region.

A similar light emitting element as described in Embodiment 1 can be used for the second light emitting elements 304B and 304C. In this case, substantially identical light emitting elements 304B and 304C may be used for the plurality of light emitting elements, and with this arrangement, output or the like can be easily controlled. Alternatively, light emitting elements 304B and 304C with different semiconductor layer compositions, semiconductor layer structures, wavelengths of emission, shapes of elements or the like can be used, according to the need.

Moreover, in FIG. 3, a plurality of the recesses (303B and 303C) is defined to accommodate one of the second light emitting elements 304B and 304C respectively so that, in this case, the yellow light emitting region has a light emitting area twice as large as that of the recess 303A of the blue light emitting region. Thus, yellow light with high output can be obtained by varying the size of the light emitting region.

In this configuration, the yellow light emitting region is formed with a plurality of small light emitting regions which are spaced apart from each other, such as the recesses 303B and 303C. Accordingly, the degree of directivity can be adjusted, or the respective emission wavelengths can be changed, so that the degree of design freedom can be improved.

A single large recess larger than the recess serving as the blue light emitting region may be defined as the yellow light emitting region, other than defining a plurality of substantially identical recesses 303B and 303C as shown in FIG. 3.

Alternately, using the base substrate 201 having two recesses as shown in FIG. 2, the first light emitting element 304A may be disposed in the recess 203A and a plurality of the light emitting elements, for example, the second light emitting elements 304B and 304C may be disposed in the recess 203B. In this case, although the area of the blue light emitting region and the yellow light emitting region are substantially the same, output of the yellow light region can be made higher. Thus, the number of the recesses and the number of light emitting elements can be different from one another.

Other than the light emitting elements 304A, 304B and 304C, substantially the same members as in Embodiment 1 can also be used in Embodiment 3.

Embodiment 4

Figure 4:
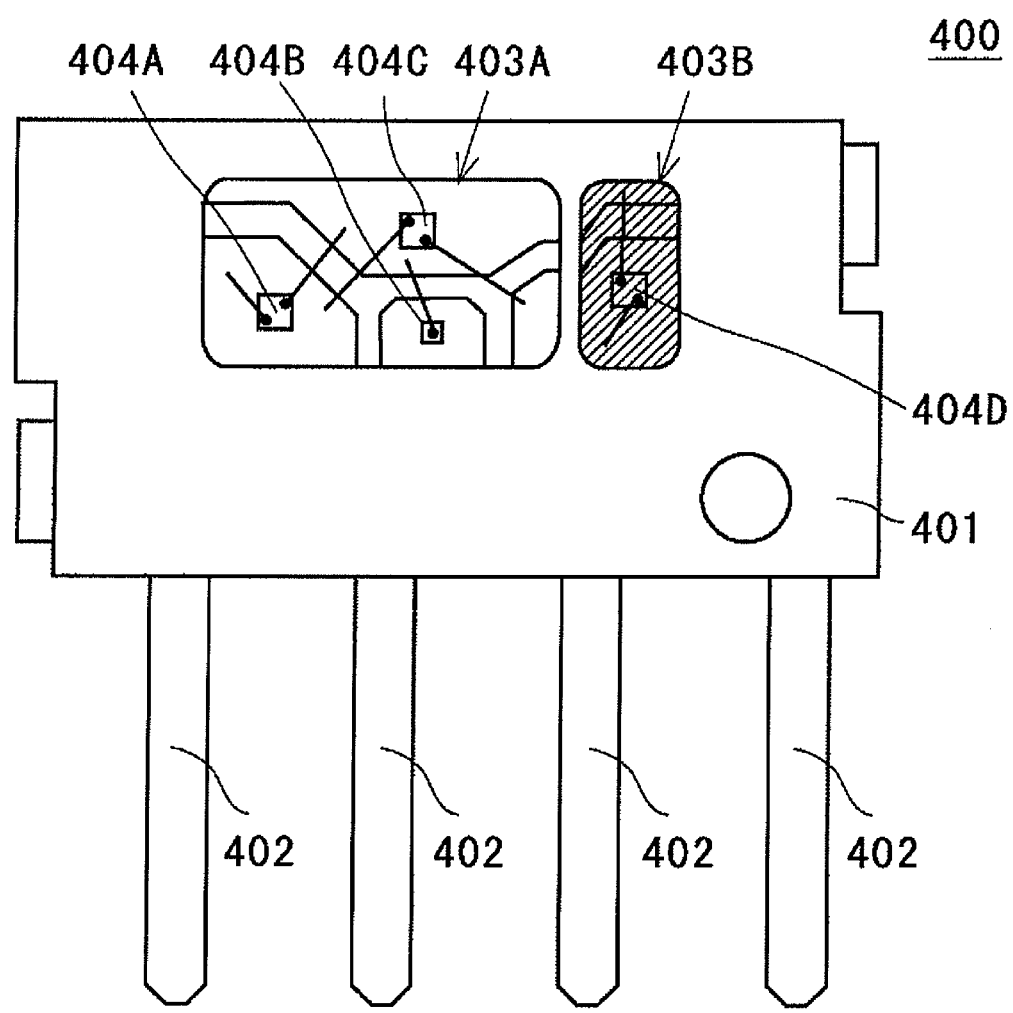
FIG. 4 is a front elevational view showing an example of a light emitting device according to Embodiment 4 of the present invention.

FIG. 4 is a front elevational view showing a light emitting device 400 according to Embodiment 4. In Embodiment 4, a base substrate 401 of the light emitting device 400 is made of a resin and includes recesses 403A and 403B with an upward opening defined by an annular side surface and a bottom surface. As conductive members, lead frames 402 is provided on the bottom surface of each of the recesses 403A and 403B so as to be exposed within the recesses 403A and 403B. A part of each of the lead frames 402 is enclosed in the base substrate 401 and another part of each of the lead frames 402 is extended outwardly from the side surface of the base substrate 401. Accordingly, the lead frames 402 serve as conductor wiring for a plurality of semiconductor light emitting elements 404A to 404D or the like arranged on the base substrate 401. The semiconductor light emitting elements 404A to 404D are fixed respectively on the lead frames 402 by a die bonding member (not shown in the figure) such as a resin and a metal paste. Then, the p-electrodes and n-electrodes of the semiconductor light emitting elements are electrically connected with the lead frames 402 by conductive wires, respectively. Because the light emitting element 404B uses a conductive substrate, only one wire is used, and the electric conduction is obtained by connecting the wire onto the lead frame 402 with a conductive bonding member. A sealing member such as a resin is filled within the recess to cover the electric components as in Embodiment 1.

In Embodiment 4, the recess 403A accommodates an InGaN-based blue light emitting element 404A as the first light emitting element to form a first light emitting part of a blue light emitting region, and a GaAs-based red light emitting element 404B and an InGaN-based green light emitting element 404C as the third light emitting elements. The recess 403B accommodates an InGaN-based blue light emitting element 404D as the second light emitting part and is filled with a sealing member containing a wavelength converting member, to form a yellow light emitting region as in Embodiment 1.

In Embodiment 4, the recess 403A accommodating the first light emitting element 404A also accommodates the third light emitting elements 404B and 404C having different emission color than that of the first light emitting element 404A. Therefore, when all of the light emitting elements 404A to 404C are simultaneously lighted, the output from the recess 403A is greater than the output from the recess 403B. Even in such cases, yellow light, obtained by using a InGaN-based light emitting element as the second light emitting element 404D and converting light from the second light emitting element 404D by a wavelength converting member, has a higher output than light emitted from a conventional yellow light emitting element, so that color reproductivity can be improved. Particularly, adding yellow light, which is complementary to a light having a wavelength in a range between green and red, allows reproducibility to be greatly improved.

In Embodiment 4, the recess 403A has a larger opening portion than that of the recess 403B to accommodate a plurality of light emitting elements 404B and 404C in addition to the first light emitting element 404A. Therefore, in the cases in which, for example, the output of the first light emitting element 404A is small, the blue light emitting region may not coincide with the size of the opening. The "blue light emitting region" in such cases means a region to which light from the first light emitting element 404A substantially reaches.

Third Light Emitting Element and Other Light Emitting Elements

In Embodiments 1 to 4, a light emitting element of a different emission color may further be used in a color image reading device in addition to the first and second light emitting elements which are used for the blue light emitting region and the yellow light emitting region respectively. For example, a red light emitting element (GaAs-based, InP-based etc.), a green light emitting element (ZnSe and nitride-based semiconductors ($In_xAl_yGa_{1-x-y}N$ $0 \leqq X$, $0 \leqq Y$, $X+Y \leqq 1$)), and visible light emitting elements having colors therebetween, and others such as an infrared light emitting element, an ultraviolet light emitting element can be used. Further, a Zener diode, a bidirectional diode or the like can also be used as a protective element.

Other members used in the invention will be described below.

Base Substrate

A base substrate (e.g., the base substrate 101, 201, 301 and 401) serves to protect an electric component such as a light emitting element and a protective element, and includes a conductive member such as a lead frame that supplies external electric current to the electric components. The shape of the base substrate is preferably quadrangular or nearly quadrangular in plan view, but not limited to such shape. For example, triangular, quadrangular, polygonal, or a similar shape thereto in plan view can be employed. In addition, as shown in FIG. 4, the base substrate may have a shape defining a recess portion in each of the side surfaces from where a part of a lead frame is protruded.

The base substrate shown in FIGS. 1A to 4. includes the recesses. However, a base substrate is not limited to a shape including the recesses. For example, a flat base substrate can also be used. In such cases, a sealing member can be provided by using a printing method, a transfer mold method or the like.

As the resin for the base substrate, an insulating member is preferable, and further, the member which does not easily transmit light from the light emitting element and external light is preferable. Also, a thermosetting resin, a thermoplastic resin or the like, a resin having a certain degree of mechanical strength can be used. Specific examples thereof include, but not limited to, a phenol resin, a glass epoxy resin, BT resin, and PPA.

Lead Frame

A lead frame (e.g., the lead frames 102A, 102B and 402) is electrically connected to a light emitting element and serves as an external connecting terminal. The material for the lead frame preferably has a relatively large thermal conductivity. When the lead frame is made of such a material, heat generated in the light emitting element can be released efficiently. For example, a material with thermal conductivity of approximately 200 W/(m·K) or higher is preferable. Moreover, it is preferable to use a material having relatively large mechanical strength, or a material on which punching process or etching process can be easily performed. Specific examples thereof include metals such as copper, aluminum, golds silver, tungsten, iron, and nickel, or iron-nickel alloy, phosphorus bronze, copper containing iron, or the like.

Sealing Member

A sealing member (e.g., the sealing member 105) serves to protect is a member for protecting the semiconductor light emitting element and the protective element, which are mounted on a base substrate, from dust, moisture, external force or the like. The sealing member preferably has light transmitting property that is capable of transmitting light from the semiconductor light emitting element. Specific examples thereof include a silicone resin, an epoxy resin, and a urea resin. In addition to above-described materials, a coloring agent, a light diffusing agent, a filler, a color conversion member (fluorescent member) or the like, may be included as desired.

The filling amount of the sealing member is required to be sufficient to cover the semiconductor light emitting element, the protective element such as Zener diode, and a conductive wire, or the like.

Die Bonding Member

Die bonding member is a bonding member for mounting a semiconductor light emitting element, a protective element or the like, on a base substrate or a conductive member. Either a conductive die bonding member or an insulating die bonding member can be selected according to the base substrate on which the element is mounted. For example, for a semiconductor light emitting element in which nitride semiconductor layers are stacked on a sapphire substrate which is an insulating substrate, a die bonding member of either insulating or conductive can be used. When a conductive substrate such as SiC substrate is used, conduction can be established by using a conductive die bonding member. Examples of the insulating die bonding member include, but not limited to, an epoxy resin and a silicone resin. When the above described resins are used, a metal layer having high reflectivity such as an Al layer may be provided on the back surface of the semiconductor light emitting element, in consideration of deterioration due to light and heat from the semiconductor light emitting element. In this instance, a method such as vacuum evaporation, sputtering, or thin layer bonding can be employed. Examples of conductive die bonding members include, but not limited to, a conductive paste of silver, gold, or palladium, a solder such as Au—Sn eutectic, and a brazing filler metal such as a low melting temperature metal. Moreover, among such die bonding members, especially when a transparent die bonding member is used, a fluorescent member capable of absorbing light from the semiconductor light emitting element and emitting light in different wavelength may be included.

Conductive Wire

The conductive wire connecting the electrode of the light emitting element and the conductive member provided on the base substrate is required to provide good ohmic contact, mechanical connection, electric conduction property, and thermal conduction property to the conductive members. Thermal conductivity of 0.01 cal/(s)(cm²)(° C./cm) or greater is preferable, and 0.5 cal/(s)(cm²)(° C./cm) or greater is more preferable. In addition, it is preferable that the diameter of the conductive wires be greater than or equal to Φ 10 µm and less than or equal to Φ 45 µm in view of workability, etc. The conductive wire can be a wire made of a metal such as gold, copper, platinum, and aluminum, or the like, or an alloy using these metals.

The light emitting device according to the present invention can emit high output yellow light, and therefore, can be used in an illuminating device for an image reading apparatus of a facsimile, a copier, a hand scanner or the like.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims. This application is based on application No. 2007-107695 filed in Japan on Apr. 17, 2007, the contents of which are incorporated hereinto by reference.

What is claimed is:

1. A light emitting device comprising:
   a blue light emitting region having a first light emitting part including a first nitride semiconductor light emitting element; and
   a yellow light emitting region having a second light emitting part and a wavelength converting member arranged to absorb light from the second light emitting part and to convert the wavelength of the light from the second light emitting part to emit yellow light, the second light emitting part including a second nitride semiconductor light emitting element,
   the second light emitting part having a higher output than that of the first light emitting part.

2. The light emitting device according to claim 1, wherein the second light emitting part has a larger emitting area than the first light emitting part.

3. The light emitting device according to claim 2, wherein the second nitride semiconductor light emitting element of the second light emitting part has a larger emitting area than the first nitride semiconductor light emitting element of the first light emitting part.

4. The light emitting device according to claim 1, wherein the second light emitting part includes an additional second nitride semiconductor light emitting element.

5. The light emitting device according to claim 2, wherein the second light emitting part includes a plurality of nitride semiconductor light emitting elements.

6. The light emitting device according to claim 1, wherein the yellow light emitting region includes a plurality of light emitting regions spaced apart from each other with each of the light emitting regions including at least one nitride semiconductor light emitting element.

7. The light emitting device according to claim 2, wherein the yellow light emitting region includes a plurality of light emitting regions spaced apart from each other with each of the light emitting regions including at least one nitride semiconductor light emitting element.

8. The light emitting device according to claim 4, wherein the yellow light emitting region includes a plurality of light emitting regions spaced apart from each other with each of the light emitting regions including at least one of the second nitride semiconductor light emitting elements.

9. The light emitting device according to claim 1, further comprising
   a base substrate including first and second recess parts with the blue light emitting region being formed in the first recess part and the yellow light emitting region being formed in the second recess part.

* * * * *